(12) United States Patent
Crippa et al.

(10) Patent No.: US 7,227,368 B2
(45) Date of Patent: Jun. 5, 2007

(54) TESTING HEAD CONTACT PROBE WITH AN ECCENTRIC CONTACT TIP

(75) Inventors: Giuseppe Crippa, Merate (IT); Stefano Felici, Robbiate (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 0 days.

(21) Appl. No.: 11/090,970

(22) Filed: Mar. 24, 2005

(65) Prior Publication Data

US 2005/0270044 A1 Dec. 8, 2005

(30) Foreign Application Priority Data

Mar. 24, 2004 (EP) .................................. 04425205

(51) Int. Cl.
*G01R 31/02* (2006.01)
(52) U.S. Cl. ....................................... 324/754; 324/761
(58) Field of Classification Search ........ 324/754–762, 324/72.5; 439/482, 824
See application file for complete search history.

(56) References Cited

U.S. PATENT DOCUMENTS

| 4,773,877 | A | * | 9/1988 | Kruger et al. .............. 439/482 |
|---|---|---|---|---|
| 5,923,178 | A | | 7/1999 | Higgins et al. |
| 6,411,112 | B1 | | 6/2002 | Das et al. .................... 324/754 |
| 6,847,221 | B2 | * | 1/2005 | Kimoto et al. .............. 324/762 |
| 6,859,054 | B1 | * | 2/2005 | Zhou et al. ................. 324/754 |
| 6,967,492 | B2 | * | 11/2005 | Tsui et al. ................... 324/754 |

FOREIGN PATENT DOCUMENTS

| DE | 38 18728 A1 | 12/1989 |
|---|---|---|
| EP | 1243931 | 7/2004 |

* cited by examiner

*Primary Examiner*—Vinh P. Nguyen
(74) *Attorney, Agent, or Firm*—Robert Iannucci; Seed IP Law Group PLLC

(57) ABSTRACT

A contact probe for a testing head effective to test a plurality of semiconductor-integrated electronic devices comprises a rod-like probe body having a cross section of prefixed contour and provided in correspondence with at least one end with an eccentric contact tip. The contact tip is positioned within the contour of the cross section of the probe body.

23 Claims, 5 Drawing Sheets

TESTING HEAD CONTACT PROBE WITH AN ECCENTRIC CONTACT TIP

BACKGROUND OF THE INVENTION

1. Field of the Invention

The present invention relates to a contact probe for a testing head effective to test a plurality of semiconductor-integrated electronic devices comprising a plurality of so-called contact pads.

The invention particularly, but not exclusively, relates to a testing head having vertical probes for testing semiconductor-integrated electronic devices and the following description is made with reference to this field of application for convenience of illustration only.

2. Description of the Related Art

As it is well known, a testing head is essentially a device effective to electrically interconnect a plurality of contact pads of a semiconductor-integrated electronic device with corresponding channels of a testing machine which performs the test thereof.

The test carried out on integrated electronic devices is effective to detect and isolate devices already faulty during the manufacturing step. Normally, testing heads are thus used for the electric test of the semiconductor-integrated electronic devices, or integrated on a silicon wafer, before cutting and assembling the same inside a package for containing chips.

The connection between the testing apparatus and the contact pads of the tested integrated electronic device being tested is carried out by using a plurality of contact elements or probes.

In particular, these contact probes are normally made of wires of a special alloy having good electrical and mechanical properties.

The good connection between the probes and the contact pads is also ensured by the pressure of each contact probe on the respective contact pad.

A testing head having vertical probes comprises at least a pair of dies or plate-like parallel holders placed at a certain distance from one another in order to leave an air gap as well as a plurality of contact probes.

Each plate-like holder, called die in the technical field here considered and hereafter in the description, is provided with a respective plurality of through-going guide holes, each hole in one of the dies corresponding to a hole in the other die, wherein a respective contact probe is slidingly engaged and guided. In particular, the movable contact probes elastically flex inside the air gap between the two dies.

Testing heads of this type are commonly called "vertical probes".

Figure 1:
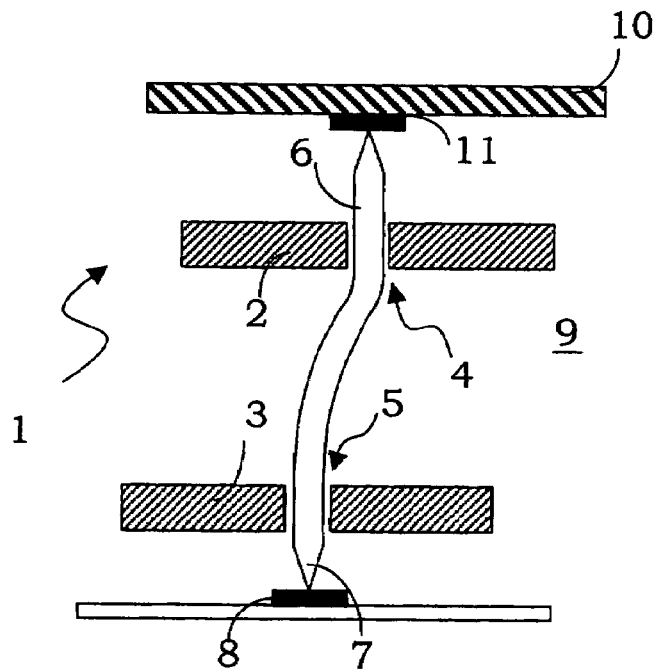

As schematically shown in FIG. 1, a testing head 1 of the known type comprises at least an upper die 2 and a lower die 3, having respective upper 4 and lower 5 through-going guide holes wherein at least one contact probe 6 is slidingly engaged.

The contact probe 6 has a contact end or tip 7. In particular, the contact tip 7 is in mechanical contact with a contact pad 8 of an integrated electronic device to be tested, performing at the same time the electrical contact between said device and a testing apparatus (not shown) of which this testing head is a terminal element.

The upper 2 and lower 3 dies are suitably spaced from an air gap 9 which allows the deformation or inclination of the contact probes 6 during the normal operation of the testing head, i.e. when this testing head comes into contact with the integrated electronic device to be tested. Moreover, the upper 4 and lower 5 guide holes are sized in order to guide the contact probe 6.

FIG. 1 schematically shows a testing head 1 having loose-fitting probes associated with a micro-contact strip or space transformer, globally indicated with 10.

In this case, the contact probes 6 have a further contact tip towards a plurality of contact pads 11 of the space transformer 10, the good electrical contact between probes and space transformer 10 being ensured in a similar way to the contact with the integrated electronic device to be tested through the pressure of the probes 6 on the contact pads 11 of the space transformer 10.

A very felt problem in the specific technical field is that of the reduction of the distance which separates the contact pads 8 of the device being tested, this distance being known in the field as "pitch".

In particular, the technological development and the miniaturization of the chips requires the continuous reduction of the pitch of the integrated electronic device to be tested, and thus the distance between two adjacent probes 6 of the testing head which performs the test thereof.

The minimum pitch depends on the geometrical conformation and on the sizes of the probes 6, according to the relation:

$$\text{Pitch min} = E + 2A\text{ min} + W\text{ min}$$

being $A\text{ min} = (F-E)/2$

Figure 2:
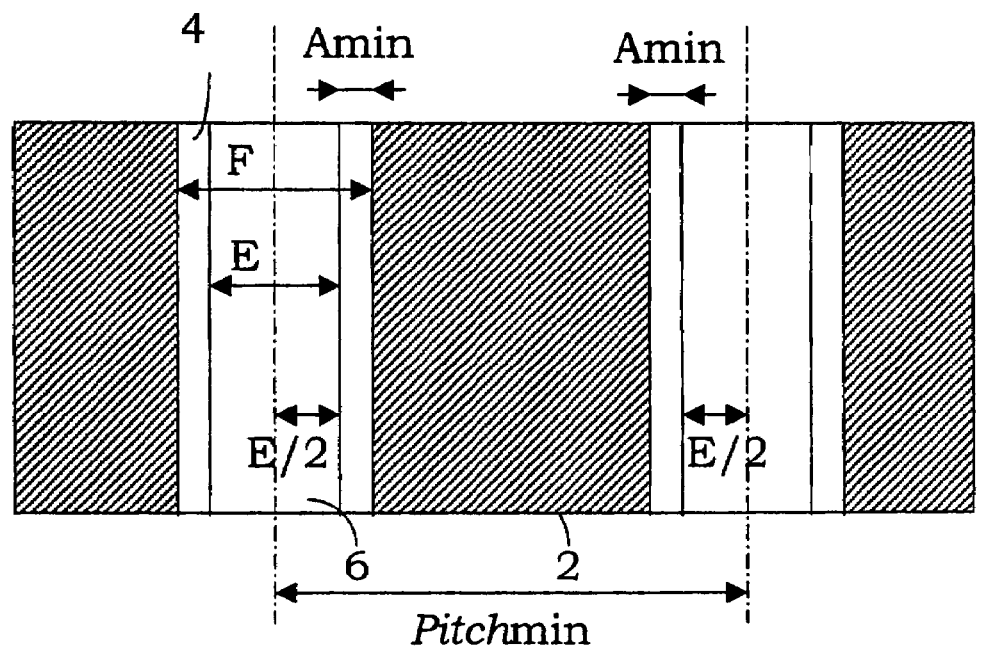

Where, as illustrated in FIG. 2 which shows a section view of a part of the testing head 1 according to the prior art:

Pitchmin is the minimum pitch, i.e. the minimum distance between the centers of two adjacent contact pads 8 of the integrated electronic device to be tested;

E is the value of the cross section axis of the probe 6.

Wmin is the minimum value of the wall thickness between a guide hole 4 and 5 and the subsequent, such as to guarantee a certain mechanical strength to the structure of the testing head 1; and F is the value of the cross section axis of the guide hole 4.

In the current vertical technologies, normally using probes having circular cross section, a reduction of the pitch value is obtained by reducing the size of the probe 6, in particular their minimum axis E (corresponding to the minimum diameter in the case of probes having circular section), being the other factors of the preceding relation practically fixed by the technological limits of realization of the testing heads.

This solution collides with the need of using probes 6 having sufficiently high section, able to guarantee a strength of the contact carried out by means of these probes, still miniaturizing the contacts.

Moreover, most integrated devices have contact pads arranged on all the four sides of the device to be tested. In this case the arrangement of the probes in correspondence with the device angles is to be taken into account, so as to avoid the contact with one another which would invalidate the outcome of the test performed.

It is known from the Italian patent application No. MI2001A000567 filed on Mar. 19, 2001 in the name of Technoprobe S.r.l., as well as from the corresponding European patent application No. 1 243 931 of Mar. 15, 2002 and from the corresponding U.S. patent application Ser. No. 10/102,449, now issued U.S. Pat. No. 6,768,327, to realize contact probes for testing heads provided with a rigid arm laterally projecting from a probe body, as schematically shown in FIG. 3.

Figure 3:
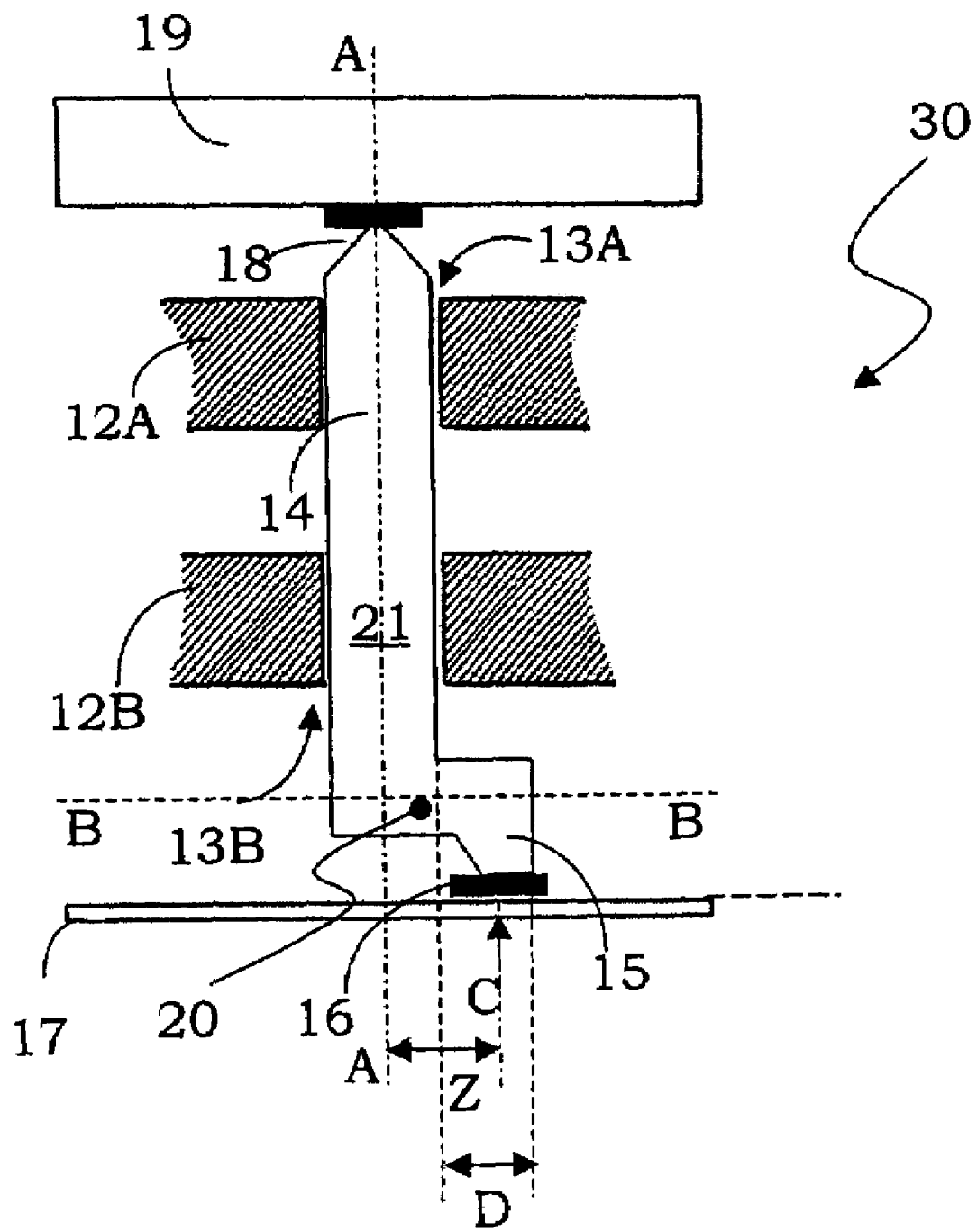

In particular, the testing head 30 shown in FIG. 3 comprises an upper die 12A and a lower die 12B having respective guide holes 13A and 13B effective to house a contact probe 14.

The contact probes 14 have contact tips 15 intended for abutting on a plurality of contact pads 16 of an integrated electronic device to be tested, schematically indicated with 17.

The testing head 30 shown in FIG. 3 comprises loose-fitting probes having a further end 18 in contact with a micro-contact strip or space transformer 19.

A rigid arm 20 extends along a direction being perpendicular or sloping of a suitable angle with respect to the probe 14, i.e. it has an axis B-B being perpendicular or sloping with respect to an axis A-A of the contact probe 14, and it ends with the contact tip 15 of the probe 14 for the contact pads 16 of the integrated electronic device 17 to be tested.

In this way, the contact between the tip 15 of the probe 14 and the pad 16 is spaced of a value Z with respect to the axis A-A of the contact probe 14 itself thus allowing to reduce the value of the minimum pitch of the contact tips 15 and making it possible to test integrated electronic devices with contact pads 16 with close contact centers C, i.e. reduced pitches, Z being the distance between the axis AA and a parallel axis passing through the contact center C of the probe.

Although advantageous under several aspects, the testing head 30 realized according to the prior art has different drawbacks.

The first among all stays in the need of deforming the probe body 21 so as to realize the rigid arm 20. The method for realizing the contact probe has thus to provide a deformation step which must be very precise and repeatable, in order to guarantee the fittingness of all the probes belonging to a same testing head.

Beside adding a critical step to the method for realizing the contact probes, this deformation introduces weakness elements in the body 21 of the probe itself.

Moreover, the total space of the contact probe thus realized suffers from the longitudinal size D introduced by the rigid arm 20.

BRIEF SUMMARY OF THE INVENTION

An embodiment of the present invention is a contact probe having a simple configuration and not needing deformation operations of the body of the probe itself, effective to ensure a good electrical contact with an integrated electronic device to be tested, and in the meantime to allow the reduction of the minimum value of the distance between adjacent probes in a testing head and thus also the pitch of the contact pads of the integrated electronic devices to be tested.

The contact probe has an eccentric contact tip positioned within the contour of a cross section of the probe body.

Another embodiment of the present invention is directed to a testing head having vertical probes of the type comprising at least a first and a second die respectively provided with at least one guide hole for housing at least one contact probe effective to ensure the mechanical and electrical contact with a corresponding contact pad of an integrated electronic device to be tested, the eccentric contact tip comprising a rod-like probe body having a cross section of prefixed contour and provided in correspondence with at least one end with an eccentric contact tip which is positioned within the contour of said section.

Yet another embodiment of the present invention relates to a method for realizing a contact probe of the type comprising at least one rod-like probe body having cross section of prefixed contour and provided in correspondence with at least one tip portion with an eccentric contact tip, the method comprising at least one cutting step of the tip portion along a plurality of cutting planes sloping with respect to a section plane being orthogonal to an axis of the probe body, the cutting planes passing through the eccentric contact tip which is positioned within the contour of the cross section.

The characteristics and advantages of the contact probe, of the testing head and of the method according to the invention will be apparent from the following description of embodiments thereof given by way of indicative and non-limiting example with reference to the annexed drawings.

BRIEF DESCRIPTION OF THE SEVERAL VIEWS OF THE DRAWING(S)

Figures 4A, 4B:
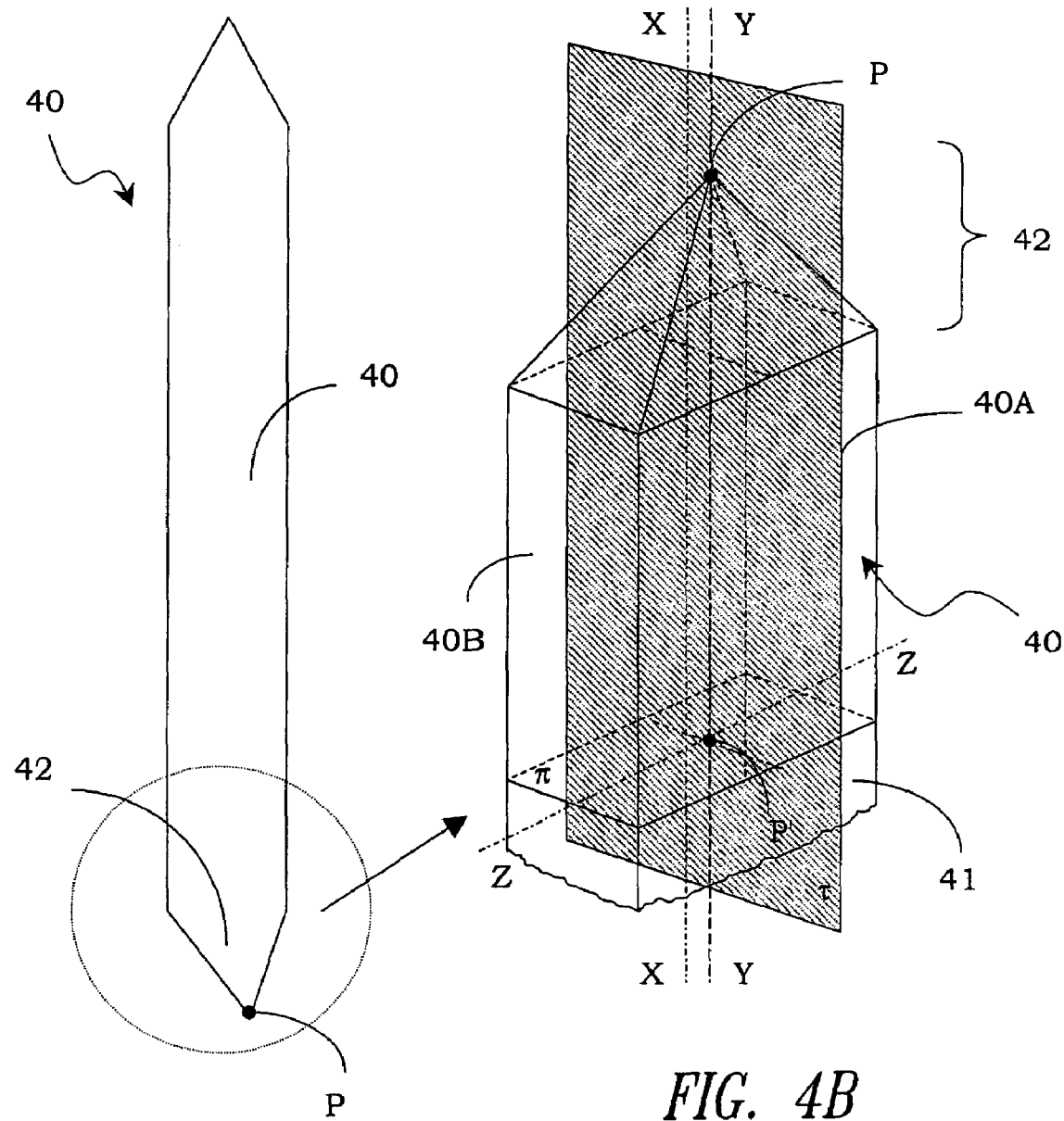
Figure 5:
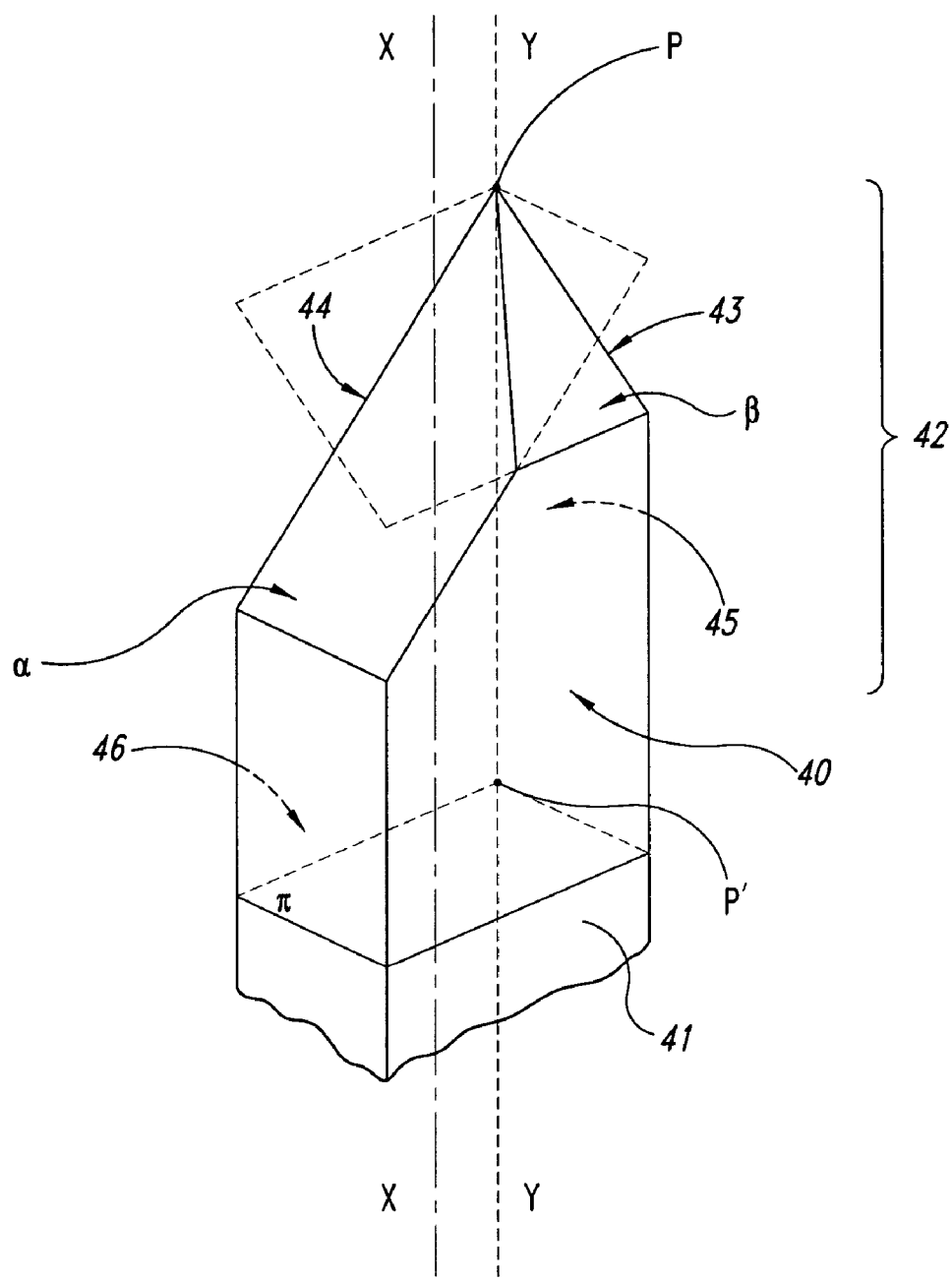
Figure 6A:
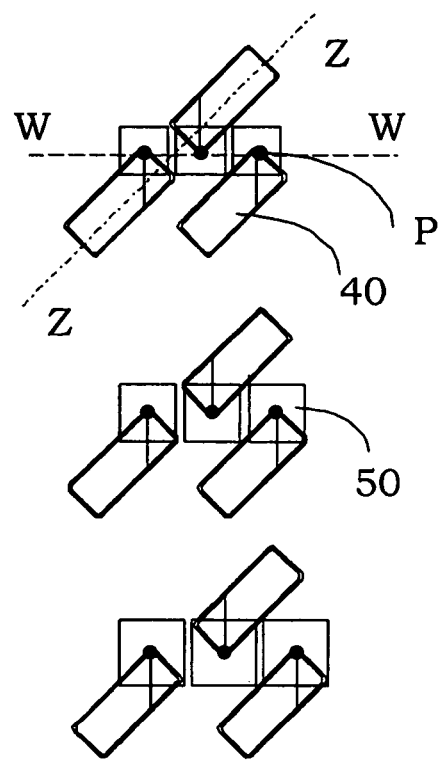
Figure 6B:
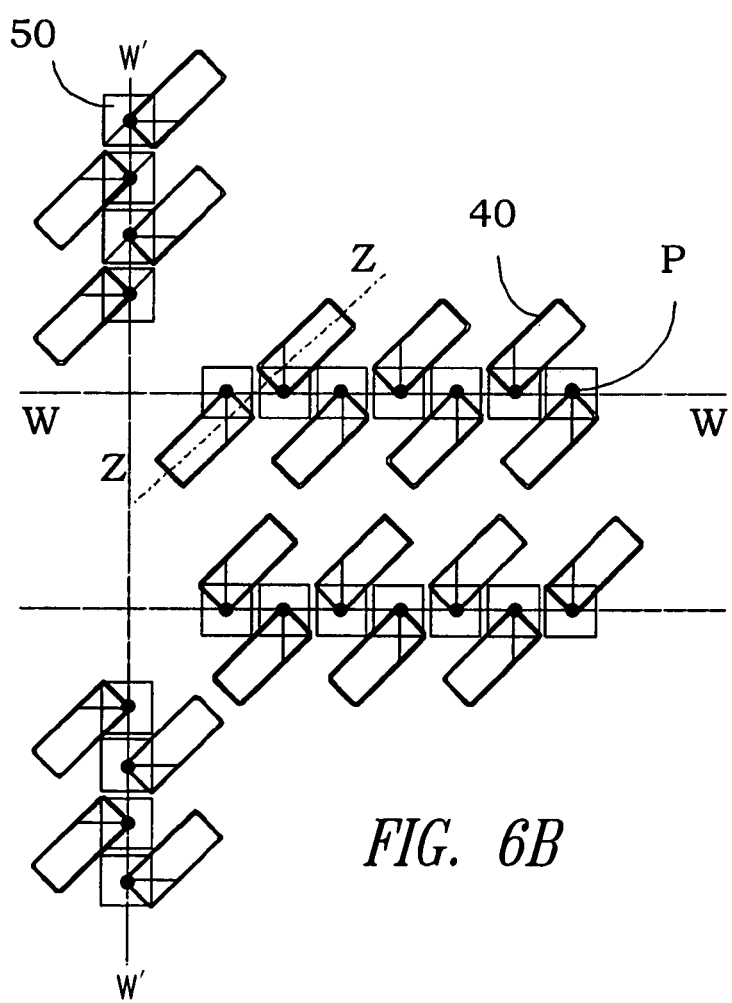

FIG. 1 schematically shows an embodiment of a testing head according to the prior art;

FIG. 2 schematically shows a section view of a portion of the testing head of FIG. 1;

FIG. 3 schematically shows a second embodiment of a testing head according to the prior art;

FIGS. 4A and 4B schematically show a contact probe for a testing head realized according to an embodiment of the invention;

FIG. 5 schematically shows a further contact probe for a testing head realized according to another embodiment of the invention;

FIGS. 6A and 6B schematically show particular top configurations of a plurality of contact probes of FIG. 5.

DETAILED DESCRIPTION OF THE INVENTION

Making reference to FIG. 4A, 40 globally and schematically indicates a contact probe according to an embodiment of the invention.

FIG. 4B shows an enlarged view of the sole end or tip 42 portion of the probe, in correspondence with a contact tip P effective to put into contact a contact pad of a device to be tested (not shown).

As it has been seen with reference to the prior art, the contact probe 40 has a substantially rod-like probe body 41 having a central longitudinal axis XX and an overall contour. The probe 40 also includes a tip portion 42 extending from the probe body 41 and provided with an eccentric contact tip P.

Advantageously according to an embodiment of the invention, the contact tip P of the probe 40 is positioned within an extension of the contour of the probe body 41, as shown in FIG. 4B where the projection P' of the contact tip P in correspondence with a section plane $\pi$ has been indicated.

It is proper to underline that "contour" of the probe body means, in a general way, the envelope defining the maximum space of the probe body. In some cases, this envelope does not coincide with the geometrical perimeter of the cross-sections of the probe body 41, such as in the cases of the probe body being lobed or provided with convex angles. In a similar way, in the case of probe bodies with non-uniform cross-sections, the word "contour" indicates the union of the different cross-sections, once again defining the maximum space of the probe body.

Advantageously according to an embodiment of the invention, the tip 42 portion thus defines a tip P decentralized with respect to the central longitudinal axis XX of the probe, but it does not increase the total space thereof.

It is thus possible, by realizing a testing head by using a plurality of probes 40 according to an embodiment of the invention, to reduce the distance between the probes themselves by using an alternated configuration, such as those shown in the FIGS. 6A and 6B, in the case of contact pads 50 arranged along a single side of the device to be tested or along more sides, respectively.

In fact, the contact probe 40 with eccentric contact tip P defines a different space with respect to an axis YY parallel to the central longitudinal axis XX and passing through the contact tip P.

In particular, as shown in FIG. 4B, a plane τ passing through the axis YY defines a first 40A a second 40B probe portion, these portions having different space and in particular this first portion 40A having an overall space lower than said second portion 40B.

It is thus possible, by orienting the portions with greater space of the probes 40 in an alternated way, to increase the packing of the probes themselves, thus decreasing the pitch of the device which the testing head thus realized is able to test.

FIG. 5 shows a preferred embodiment of the probe 40, wherein the contact tip P is positioned on an outer surface that is a straight extension of the contour of the probe body. In particular, the axis YY extending through the contact tip P is positioned at the corner of two surfaces 43, 44 that are straight extensions of side surfaces 45, 46, respectively, of the probe body 41.

In this way, the probe 40 has a space being totally to one side with respect to the axis YY and the probes can be close to the maximum, by alternating the arrangement in correspondence with the contact pads, as shown in the FIGS. 6A and 6B.

In particular, in FIG. 6A, the probes 40 have an axis ZZ of the cross section sloping with respect to an alignment axis WW of the contact pads 50.

Moreover, advantageously according to an embodiment of the invention, the contact probes 40 are arranged in an alternated way and they suitably slope, in particular according to an angle of 45°. In this way, the distance between the contact probes 40 is ensured also in correspondence with the distribution angles of the contact pads on the four sides of the integrated device to be tested, as shown in FIG. 6B, where the pads have alignment axes WW and W'W' being orthogonal one another.

Moreover, in the embodiments shown in the FIGS. 4A, 4B and 5, the contact probes 40 advantageously have non circular section. In this way, by using corresponding guide holes with rectangular section, it is possible to orient the probes as desired in a simple and safe way. Also, contact probes 40 having a substantially rectangular section, in particular having rounded corners could be advantageously used.

In reality, although FIGS. 4A, 4B and 5 show contact probes with non circular sections, and in particular rectangular, the invention is not limited to these embodiments, traditional probes with circular sections being usable as well as probes with oval sections.

It is thus possible to obtain a testing head comprising a plurality of contact probes having eccentric contact tips and thus portions of different space, suitably orientated in order to alternate these portions of different space, by reducing the minimum safety distance between the probes, thus allowing to close the corresponding contact pads on the device to be tested, i.e. reducing the pitch of this device.

In particular, a testing head according to an embodiment of the invention comprises at least an upper die and a lower die having respective upper and lower through-going guide holes within which at least one contact probe 40 is slidingly engaged having an eccentric contact tip P.

In general, the testing head comprises a plurality of contact probes 40 arranged so that probes adjacent with each other have axes ZZ sloping with respect to an alignment axis WW of the contact pads 50 of the device to be tested.

In a preferred embodiment, the axes ZZ of the probes 40 and the alignment axis WW of the contact pads form an angle of 45°, as shown in the FIGS. 6A and 6B.

It is also possible to provide that the testing head comprises at least an air gap placed between the dies and effective to allow the contact probe 40 to deform when said contact tip P abuts on the corresponding contact pad of the device to be tested.

In a preferred embodiment of the testing head according to an embodiment of the invention the contact probes 40 have at least a pre-deformed section.

The invention also makes reference to a method for realizing a contact probe of the type comprising at least one probe body and a tip portion wherein an eccentric contact tip of the probe is defined, the method comprising at least one cutting step of the tip portion of the probe according to a plurality of cutting planes sloping with respect to the section plane π and passing through the eccentric contact tip P.

In the case of probes having rectangular section, such as that shown in FIG. 5, the method for realizing a contact probe according to an embodiment of the invention advantageously comprises the following steps:
  a first cutting step along a first cutting plane α sloping with respect to the section plane π and passing through the contact tip P, and
  a second cutting step along a second cutting plane β sloping with respect to the section plane π and passing through the contact tip P.

In particular, these cutting planes α and β slope of 45° with respect to the section plane π and they are rotated one another of 90° in order to define the eccentric contact tip P positioned inside the contour of the cross section of the probe body.

In conclusion, advantageously according to an embodiment of the invention, the proposed contact probe with the eccentric tip allows to realize a testing head able to reduce the value of the minimum pitch of the contact tips P, making it thus possible to test integrated electronic devices with contact pads with very close contact centers C, i.e. very reduced pitches.

The eccentricity of the contact tip P and the longitudinal axis A-A of the contact probe and its positioning inside the contour of the cross section of the probe body as well as a suitable orientation of the probes allow in fact to place the contact probes 40 in an alternatively opposed position with respect to the contact pads thus considerably increasing the space available for realizing the guide holes and thus allowing the use of probes with greater diameters than those usable according to the prior art. A testing head is thus obtained being more reliable for testing the integrated electronic devices having very little pitches.

Moreover, advantageously according to an embodiment of the invention, the eccentric contact tip P is realized by means of cutting steps along cutting planes sloping with respect to the section plane π and passing through the contact tip P.

In particular, the method according to an embodiment of the invention is extremely simplified in the case of probes having rectangular section needing only two cutting operations carried out along a first α and a second β plane sloping with respect to the section plane π and passing through the contact tip P, which belongs to the contour of the cross section of the probe body.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A contact probe for use in a testing head effective to test a plurality of semiconductor-integrated electronic devices, the contact probe comprising:
    a rod-like probe body having a non-circular cross section; and
    a tip portion having an inclined surface that slopes from the non-circular cross-section of the probe body to an eccentric contact tip, wherein the inclined surface slopes with respect to a section plane orthogonal to a longitudinal axis of the probe body and extends to the eccentric contact tip, wherein the tip portion includes a further inclined surface sloping with respect to the section plane and extending to the eccentric contact tip.

2. A contact probe according to claim 1, wherein the contact tip is positioned on an outer surface that is a straight extension of a contour of the probe body.

3. A contact probe according to claim 1, wherein the probe body has a rectangular section.

4. A contact probe according to claim 1, wherein the inclined surface slope of 45° with respect to the section plane and they are sloped with respect to one another by 90°.

5. A contact probe according to claim 1 wherein the probe body is defined by a contour and the contact tip is positioned such that a projection through the contact tip and parallel to the longitudinal axis extends within the contour of the probe body.

6. A testing head comprising:
    a first die and a second die respectively provided with at least one guide hole;
    a first contact probe housed in the guide holes and effective to ensure the mechanical and electrical contact with a corresponding contact pad of an integrated electronic device to be tested, the contact probe including:
        a rod-like probe body having a non-circular cross section;
        a tip portion having an inclined surface that slopes from the non-circular cross-section of the probe body to an eccentric contact tip, wherein the incline surface slopes with respect to a section plane orthogonal to a longitudinal axis of the probe body and extends to the the eccentric contact tip, wherein the tip portion include a further inclined surface sloping with respect to the section plane and extending to the eccentric contact tip.

7. A testing head according to claim 6, further comprising a second contact probe adjacent to the first contact probe, the second contact probe having a rod-like probe body with a non-circular cross-section, wherein the contact probes have respective longitudinal axes of the cross-sections of the probe bodies sloping with respect to an alignment axis of the contact pads.

8. A testing head according to claim 7, wherein the longitudinal axes of the cross-sections of the probe bodies and the alignment axis of the contact pads form an angle of 45°.

9. A testing head according to claim 6, further comprising an air gap placed between the first and second die and effective to allow the contact probe to deform when the contact tip abuts on the contact pad.

10. A testing head according to claim 6, wherein the contact probe has at least one pre-deformed section.

11. A testing head according to claim 6, wherein the eccentric contact tip is positioned on an outer surface that is a straight extension of a contour of the probe body.

12. A testing head according to claim 6, wherein the cross-section of the contact probe is rectangular.

13. A testing head according to claim 6 wherein the probe body is defined by a contour and the contact tip is positioned such that a projection through the contact tip and parallel to the longitudinal axis extends within the contour of the probe body.

14. A testing head according to claim 6, wherein the contact tip is positioned on an outer surface that is a straight extension of an edge of the probe body at the rectangular cross-section.

15. A test structure for testing a semiconductor-integrated electronic device, the test structure comprising:
    a rod-like probe body having a non-circular cross section; and
    a tip portion having an inclined surface that slopes from the non-circular cross-section of the probe body to an eccentric contact tip, wherein the incline surface slopes with respect to a section plane orthogonal to a longitudinal axis of the probe body and extends to the eccentric contact tip, wherein the tip portions includes a further inclined surface sloping with respect to the section plane and extending to the eccentric contact tip.

16. A test structure according to claim 15, wherein the contact tip is positioned on an outer surface that is a straight extension of a contour of the probe body.

17. A test structure according to claim 15, wherein the non-circular cross section is rectangular.

18. A test structure according to claim 15, wherein the inclined surfaces slope of 45° with respect to the section plane and are sloped with respect to one another by 90°.

19. A test structure according to claim 15 wherein the probe body is defined by a contour and the contact tip is positioned such that a projection through the contact tip and parallel to the longitudinal axis extends within the contour of the probe body.

20. A test structure according to claim 15, further comprising:
    a first die and a second die each provided with a first guide hole, wherein the probe body and tip portion together comprise a first contact probe that is housed in the guide holes and effective to ensure the mechanical and electrical contact with a corresponding contact pad of an integrated electronic device to be tested.

21. A test structure according to claim 20, further comprising a second contact probe adjacent to the first contact probe, the second contact probe having a rod-like probe body with a non-circular cross-section, wherein the contact probes have respective longitudinal axes of the cross-sections of the probe bodies sloping with respect to an alignment axis of the contact pads.

22. A test structure according to claim 21, wherein the longitudinal axes of the cross-sections of the probe bodies and the alignment axis of the contact pads form an angle of 45°.

23. A test structure according to claim 20, further comprising an air gap placed between the first and second die and effective to allow the contact probe to deform when the contact tip abuts on the contact pad.

* * * * *